United States Patent [19]
Swirbel et al.

[11] Patent Number: 5,296,271
[45] Date of Patent: Mar. 22, 1994

[54] MICROWAVE TREATMENT OF PHOTORESIST ON A SUBSTRATE

[75] Inventors: Thomas J. Swirbel, Davie; Richard J. Kolcz, North Lauderdale; James L. Davis, Coral Springs, all of Fla.

[73] Assignee: Motorola, Inc., Schaumburg, Ill.

[21] Appl. No.: 4,478

[22] Filed: Jan. 12, 1993

Related U.S. Application Data

[63] Continuation of Ser. No. 714,947, Jun. 13, 1991, abandoned.

[51] Int. Cl.$^5$ .............................. B05D 1/32
[52] U.S. Cl. ................... 427/493; 427/510; 427/558; 427/272; 427/282; 427/384; 430/325; 430/328; 430/330
[58] Field of Search ............... 427/493, 510, 558, 272, 427/282, 384; 430/325, 328, 330

[56] References Cited

U.S. PATENT DOCUMENTS

| | | | |
|---|---|---|---|
| 4,243,744 | 1/1981 | Lockwood et al. | 427/45.1 |
| 4,459,320 | 7/1984 | Fefferman | 427/510 |
| 4,540,466 | 9/1985 | Nishizawa | 204/192.35 |
| 4,560,641 | 12/1985 | Kokaku et al. | 430/312 |
| 4,667,076 | 5/1987 | Amada | 427/45.1 |
| 4,698,238 | 10/1987 | Hayasaka et al. | 427/510 |

OTHER PUBLICATIONS

Brochure: E. I. Du Pont de Nemours & Co., Inc. Riston® Photopolymer Film Resist Image Transfer Systems, E-82875 (2M-Jun. 1986) entitled "Riston® Photopolymer Film 200R Series Semi-Aqueous Processable".

*Primary Examiner*—Shrive P. Beck
*Assistant Examiner*—Benjamin L. Utech
*Attorney, Agent, or Firm*—Dale W. Dorinski

[57] ABSTRACT

Photoreactive polymers are treated by exposure to microwave energy. A film of a photoreactive polymer (12), such as a photoresist, is applied to a substrate (10) and selectively exposed to ultraviolet light. The latent image produced is further cured or polymerized by treating the photoresist with microwave energy. Combinations of microwave and thermal energies are also used. The treated photoresist is then developed, producing a sidewall (17) that is vertical, and is improved by reduction of anomolies such as scum or a foot (16) at the base of the resist.

12 Claims, 3 Drawing Sheets

MICROWAVE TREATMENT OF PHOTORESIST ON A SUBSTRATE

This is a continuation of application Ser. No. 07/714,947, filed Jun. 13, 1991, and now abandoned.

TECHNICAL FIELD

This invention relates generally to photoreactive polymers and more particularly to a method of treating photoreactive polymers.

BACKGROUND

An initial step in the fabrication of a printed circuit board or other electronic substrates is the generation of a circuitry pattern from artwork or photographic film onto the substrate. In this method, the substrate containing a metal layer is coated with a protective resist material. The exact pattern desired to be printed in the metal layer is obtained by masking the resist with the desired pattern either mechanically or by use of a phototool. The resist is then exposed to a source of light which polymerizes the uncured resist. The masking or phototool is then removed and the uncured resist is dissolved away, thereby developing the desired image.

The protective resist possesses the ability to give definition and detail required in the circuit. Chemical resistance and dimensional stability are necessary requirements of the resist in order to withstand the subsequent processing steps. Dry film resists are frequently preferred over liquid resists because they offer good chemical resistance, thick plating capability, and cost savings due to less labor and fewer processing steps. Dry film resists find greatest application in the fabrication of printed circuit boards, whereas liquid resists find greatest application in fabrication of integrated circuits and similar applications.

Photosensitive resists are thin coatings produced from organic solutions which, when exposed to light of the proper wavelength, are chemically changed, altering their solubility in certain solvents. These solvents are known as developers. Two types of resists are available: negative acting and positive acting. Negative acting resists are initially soluble in the developer but after exposure to light, become polymerized and insoluble in the developer. Positive acting resists work in the opposite fashion, that is, exposure to light makes the polymer mixture more soluble in the developer. The resist material is frequently dyed to make it visible for inspection and retouching. The pattern that remains after development is insoluble and chemically resistant to cleaning, plating and etching solutions used in the production of the substrate.

The purpose of the developing process is to completely remove unwanted resist in areas to be subsequently etched or plated. Unfortunately, it is impossible in many instances to remove traces of resist during the developing step. This can occur with negative resists which tend to form a thin, cross-linked film at the resist-substrate interface. It is frequently observed that after developing, edges of the resist tend to be somewhat ragged and nonuniform as a result of swelling and deformation during developing. This problem can be overcome to some degree by using a mild plasma treatment after developing and prior to post baking. The purpose of the plasma treatment is to remove in a delicate, almost surgical manner, very tiny quantities of resist in unwanted areas. This procedure, known as plasma descumming, is a commonly practiced step in photolithography operations. The obvious side effects of this step are removal of desired resists and removal of other materials such as exposed metal plating. In thin film applications where the exposed metal plating may only be several hundred Ångstroms thick, plasma descumming can be detrimental and totally remove the metallization.

The formation of scum or a foot at the base of the resist wall is also thought to be caused by improper curing of the photoresist. After the polymeric resist has been exposed and the latent image has been generated, chemical reactions continue to occur. As a consequence, it is often necessary or advantageous to control the environment of the exposed polymer film in order to allow the desired reactions to continue to completion. Several post-exposure treatments have been reported in the literature, such as thermal treatment, flood exposure with other types of radiation, treatment with reactive gas, and vacuum treatment. Most vendors of photoresist do not encourage the use of any of these types of post-imaging treatments but suggest that the resists simply be held at ambient temperatures for fifteen-to-thirty minutes between the time of imaging and developing. None of the present commercially available photoresist systems utilize post-exposure treatment. One of the primary reasons that resist systems employing complex post-exposure reactions have not gained wide acceptance commercially is that, as a rule, these reactions are difficult to control and reproduce in a production environment. Although the reaction times of the active species are long compared to the exposure times, they are short when compared to the overall process cycle. The reactive sites created in a solid polymer also continue to decay via side reactions. If the exact extent of reaction in the latent image is to be precisely reproduced, it is necessary that the precise degree of chemical reaction be controlled across the substrate and from substrate to substrate.

In order to better illustrate problems obtained with poor definition of the photoresist sidewall, the reader is referred to FIG. 1. A substrate 10 is coated with a photoresist 12 and imaged and developed. Sidewall 14 of the photoresist 12 is not vertical but tapers off at an angle towards the substrate 10. This situation is undesirable. Another type of occurrence found using photoresist is a sidewall 15 that tapers in the opposite direction. This too is clearly undesirable. In FIG. 3, another instance of poorly developed photoresist, the sidewall is relatively vertical but a foot 16 at the base of the sidewall extends out from the photoresist 12 onto the substrate. The foot 16 must be subsequently removed by the plasma descumming operation, however, if the foot is large, descumming is not a viable option.

Clearly, an improved method of processing the photoresist is needed in order to provide the desired vertical sidewalls and to eliminate the foot at the base of the photoresist. At the present time, there are no commercially successful methods for dealing with this problem and secondary operations, such as plasma descumming, are required in order to compensate for this lack of precision. A method that would eliminate undesirable sidewall effects would also eliminate extraneous post-developing steps and be highly sought after by those in the art of photolithography.

SUMMARY OF THE INVENTION

Briefly, according to the invention, there is provided a method of treating photoreactive polymers. A photoreactive polymer is exposed to a source of microwave energy. The microwave energy treats the polymer in such a way so as to produce a more accurate vertical sidewall.

In a further embodiment of the invention, a method of processing photoresist is disclosed, comprising applying a layer of photoresist to a substrate and selectively exposing portions of the photoresist. The photoresist film is then treated with to microwave energy, and the treated film is then developed in a conventional manner.

In still a further embodiment of the invention, the photopolymer is also exposed to thermal energy. The thermal energy may be applied in a separate step or may be simultaneous with the microwave energy treatment.

DETAILED DESCRIPTION OF THE PREFERRED EMBODIMENT

Figure 1:
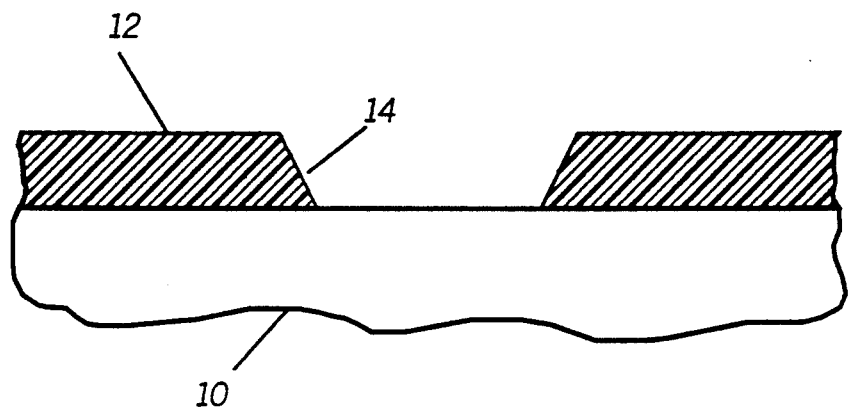
FIG. 1 is a cross section of developed photoresist on a substrate as found in the prior art.
Figure 2:
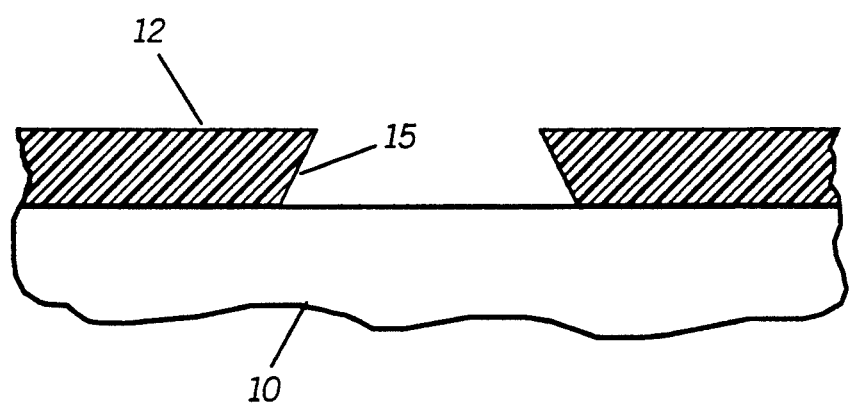
FIG. 2 is another view of the developed photoresist as found in the prior art.
Figure 3:
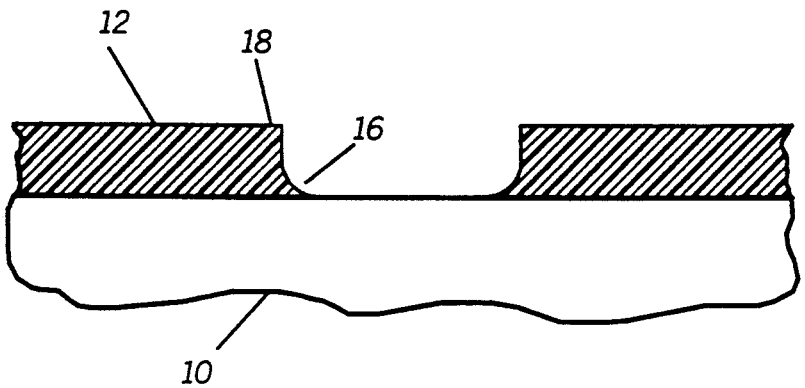
FIG. 3 is yet another view of the developed photoresist as found in the prior art.
Figure 4:
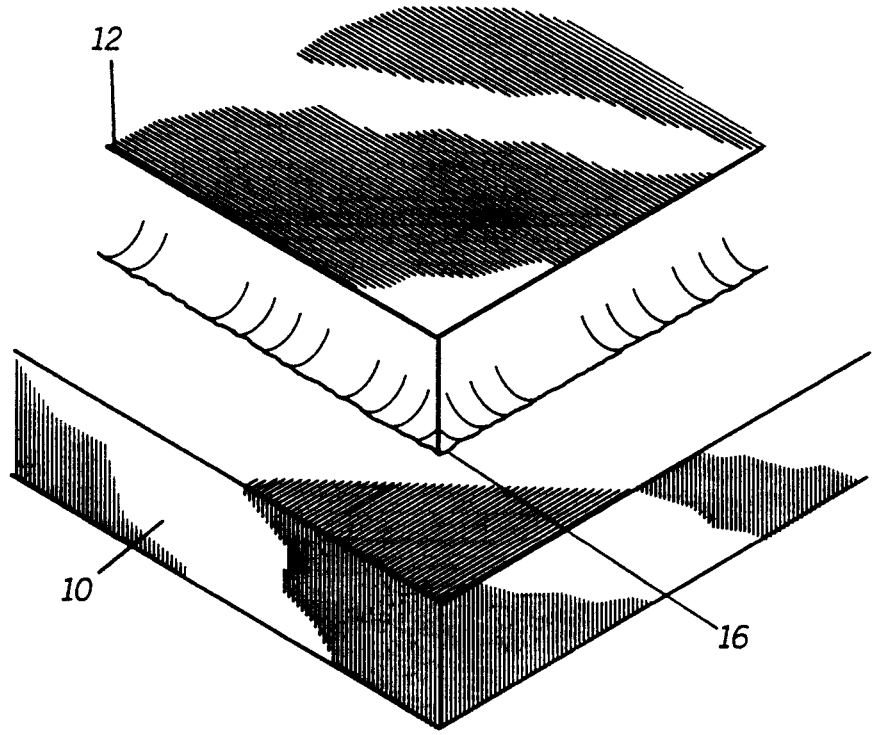
FIG. 4 is an isometric view of a photoresist developed as found in the prior art.

Referring to FIG. 4, it may be seen that a photoresist 12 treated and developed in accordance with prior art exhibits a substantial foot 16 at the base of the resist. It may be clearly seen in both FIGS. 3 and 4 that the width of the desired image is considerably less at the base 16 of the photoresist wall than it is at the top 18 of the photoresist.

The treatment of photoreactive polymers in order to uniformly cure the polymer after the latent image is created in the polymer comprises exposing the photopolymer to a source of microwave energy. The photopolymer may be any number of photopolymers but typically those of greatest interest are photoresists used in the electronics industry. The photoresist 12 is laminated onto a substrate 10 in the case of dry film, or spin-coated, roller-coated, sprayed or dipped in the case of liquid photoresists. The substrate 10 containing the coated photoresist 12 is then masked off and exposed to a source of light. In the present embodiment, the source is a highly-collimated ultraviolet light; however, uncollimated flood sources may also be used. Selected portions of the photoresist are exposed to the ultraviolet light, creating a latent image in the photoresist. The resist is then treated by exposing it to microwave energy. It is believed that the microwave energy accomplishes two tasks: 1) the photoresist is further cured by the microwave energy by cross linking and polymerization of the unreacted species in the resist. The microwaves provide an energy source to accelerate the polymerization reaction to a steady state at an increased rate, preventing unwanted formation of sidewall effects; and 2) a secondary heating effect is found during the microwaving such that the photoresist is heated most at the photoresist/substrate interface, thereby accelerating the cross-linking and polymerization in an area that would be normally the last to cross-link or polymerize. It is felt that the combination of these two mechanisms accounts for the enhanced degree of sidewall formation and foot elimination found in the present invention. Since the treatment time with microwave energy is typically relatively short, we are able to more closely reproduce the desired reaction conditions in the latent image, effecting a precise degree of chemical reaction across the substrate and from substrate to substrate.

This post-exposure curing is fairly straight forward and easily controlled. The substrates are typically placed in a holder or cassette. The cassette is placed in a microwave oven. The microwave oven used to provide the improvements in this patent is a Sharp CAROUSEL II ™ convection microwave having a seven hundred (700) watt capacity. The substrates and photoresist are cured for two and one-half (2.5) minutes at seven hundred watts. Times as low as thirty (30) seconds and as high as seven-to-ten (7–10) minutes have also been found to be useful; but 2.5 minutes has been found to be the optimum when cassettes containing twenty-five (25) two inch by two inch (2×2) substrates or twenty-five (25) four inch by four inch (4×4) substrates were processed. Other times may be found to be useful for other types and quantities of substrates. The treatment methodology and results obtained may best be understood by reference to the following examples:

EXAMPLE 1

Figure 5:
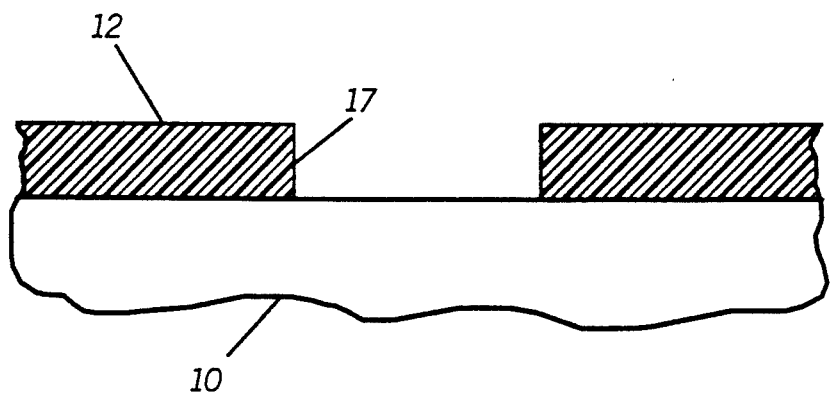
FIG. 5 is a cross-sectional view of photoresist on a substrate treated and developed in accordance with the invention.
Figure 6:
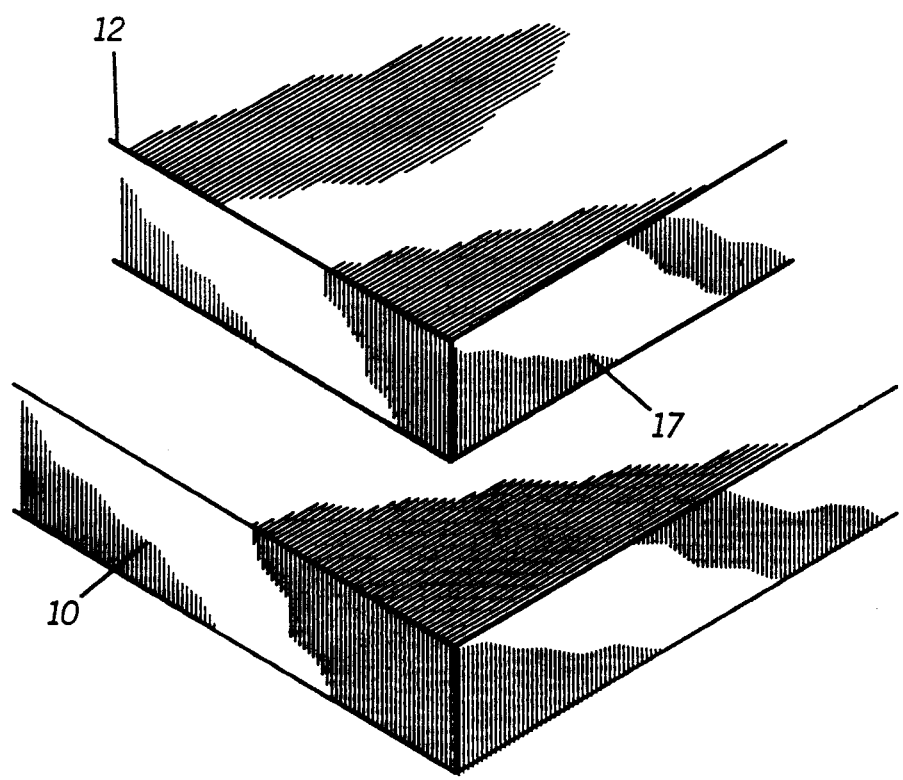
FIG. 6 is an isometric view of photoresist on a substrate treated and developed in accordance with the invention.

Fifty substrates were metallized in a vacuum sputtering chamber by depositing a layer of chrome and a subsequent layer of copper on the substrates. The metallized substrates were split into two lots of twenty-five each and laminated with Du Pont 218R Photoresist using a hot roller technique. The 218R Resist is available from the E. I. Du Pont De Nemours & Co., Inc. and is a red, dry film negative acting photoresist 1.8 mls thick. After lamination, both lots were exposed to ultraviolet light using the same source of artwork on a mask aligner, in order to provide as close as possible to identical conditions. One lot, specified as the "control lot" did not receive the post imaging microwave treatment. The second lot, specified as the "experimental lot," was placed in a microwave oven and exposed to seven hundred watts of microwave energy for two and one-half minutes. Both lots were then developed, using a semi-aqueous developer in an in-line spray chamber. After developing, each lot was examined for quality of sidewall formation. The control lot had sidewalls that resembled those shown in FIGS. 3 and 4. The experimental lot had clean, vertical sidewalls resembling those shown in FIGS. 5 and 6. Characterization of the side walls was further verified by cross sectioning and viewed on a laser-scanning microscope.

EXAMPLE 2

Thermal treatment of the substrate was also found to aid in reduction of sidewall anomalies. During the microwave experiment outlined above, the temperature of the substrate surface was monitored by using a surface thermocouple. It was found that the temperature at the substrate/photoresist interface reached one hundred thirty to one-hundred forty (130°–140° F.) degrees Fahrenheit. Further experimentation with the microwave chamber demonstrated that thermal energy may also be used. Convection heating of the substrates to 130°-140° F., yielded some improvement in sidewall definition, but not to a comparable degree as found with microwaves. Combinations of convective and microwave heating at the same time are felt to effect improved results. By using combinations of convective and microwave heating in various ratios from 25/75 convective/microwave, up to 75/25 convective/microwave, shorter residence times in the microwave chamber may be attained.

During the treatment process, no problems were noticed with arcing or sparking of the metallized substrates in the microwave chamber. It was noticed on subsequent experimental runs that extended microwave treatment induced enough heating in the substrate to oxidize the chrome layer at the surface of the substrate, creating adhesion problems between the chrome and the substrate and the chrome and the copper. The substrate used throughout these tests was alumina ceramic. Other substrates, such as neodymium titanate, were also treated.

It may seen from the foregoing that microwave treatment of photoreactive polymers results in a more uniformly cross-linked and polymerized polymer structure, creating a more uniform and highly desirable vertical wall in a developed photoresist. Similar methodologies of microwave and thermal treatment using varying amounts of wattage and residence time in the chamber, may be envisioned to fall within the scope of the invention. Accordingly, it is not intended that the invention be limited except as by the appended claims.

What is claimed is:

1. A method of processing photoresist, comprising:
    applying a film of photoresist to a substrate;
    exposing portions of the photoresist film;
    treating the photoresist film with microwave energy after the step of exposing and prior to a step of developing the photoresist film; and
    developing the photoresist film.

2. The method as described in claim 1, further comprising exposing the photoresist to thermal energy prior to a step of developing.

3. The method as described in claim 2, wherein the photoresist is simultaneously exposed to microwave energy and thermal energy prior to a step of developing.

4. The method as described in claim 1, wherein the photoresist is heated in a microwave oven.

5. The method as described in claim 1, wherein the photoresist is a negative acting photoresist.

6. An improved method of processing photoresist in order to provide a straight sidewall, comprising the steps of:
    applying a photoresist to a substrate;
    exposing portions of the photoresist to ultraviolet light;
    treating the photoresist by exposing it to microwave energy after the step of exposing to ultraviolet light and prior to a developing step; and
    developing the photoresist in order to create an image.

7. The method as described in claim 6, wherein the photoresist comprises a dry film photoresist.

8. The method as described in claim 7, wherein the photoresist is simultaneously exposed to microwave energy and thermal energy prior to the developing step.

9. The method as described in claim 6, wherein the photoresist is a negative acting photoresist.

10. The method as described in claim 6, further comprising exposing the photoresist to thermal energy prior to the developing step.

11. The method as described in claim 6, wherein the photoresist is heated in a microwave oven.

12. A method of processing photoresist in order to provide a straight sidewall, comprising the steps of:
    applying a dry film photoresist to a substrate;
    exposing the photoresist to a pattern of ultraviolet light to create a latent image;
    placing the substrate and photoresist in a microwave oven;
    curing the photoresist by exposing it to microwave energy after the step of exposing to ultraviolet light and prior to a developing step; and
    developing the photoresist with a liquid developer in order to develop the latent image.

* * * * *